(12) United States Patent
Nagai et al.

(10) Patent No.: US 7,508,046 B2
(45) Date of Patent: Mar. 24, 2009

(54) PHOTODETECTOR

(75) Inventors: Youichi Nagai, Osaka (JP); Yasuhiro Iguchi, Osaka (JP); Hiroshi Inada, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 98 days.

(21) Appl. No.: 11/709,393

(22) Filed: Feb. 21, 2007

(65) Prior Publication Data
US 2007/0194401 A1 Aug. 23, 2007

(30) Foreign Application Priority Data
Feb. 22, 2006 (JP) ............... 2006-045512

(51) Int. Cl.
*H01L 31/0224* (2006.01)
(52) U.S. Cl. ............... 257/459; 257/431; 257/432; 257/E31.124
(58) Field of Classification Search ........... 257/431, 257/432, 459, E31.124
See application file for complete search history.

(56) References Cited

U.S. PATENT DOCUMENTS 6,777,769 B2 * 8/2004 Higuchi et al. ............... 257/448

7,214,971 B2 * 5/2007 Niigaki et al. ............... 257/184

FOREIGN PATENT DOCUMENTS

| JP | 11-354762 | 12/1999 |
| JP | 2005-123217 | 5/2005 |

OTHER PUBLICATIONS

Ishihara et al., "InGaAs Linear Image Sensor for Near-Infrared Range and their applications," Light Application and Visual Science, Institute of Electrical Engineering of Japan, JN:Z0953A, vol. LAV-00 (7-13):31-36, (2006) (English Abstract).

* cited by examiner

Primary Examiner—Victor A Mandala
(74) Attorney, Agent, or Firm—Fish & Richardson P.C.

(57) ABSTRACT

A photodetector having a mechanism of suppressing light crosstalk includes a plurality of photodiodes disposed on a common semiconductor substrate, each photodiode including an absorption layer epitaxially grown on the common semiconductor substrate and being provided with an epitaxial-side electrode. Each photodiode is provided with at least one of a ring-shaped or crescent-shaped epitaxial-side electrode, an incident-side-limited condensing part which condenses incident light that is directed to the corresponding photodiode only, and emission means which is disposed on a side opposite to a light-incident side of the absorption layer and which allows light entering from the light-incident side to be easily emitted out of the photodiode.

15 Claims, 13 Drawing Sheets

FIG. 23        PRIOR ART
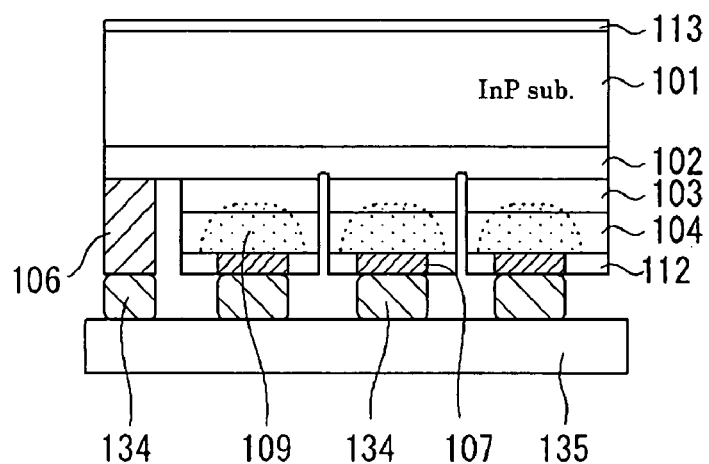
FIG. 24
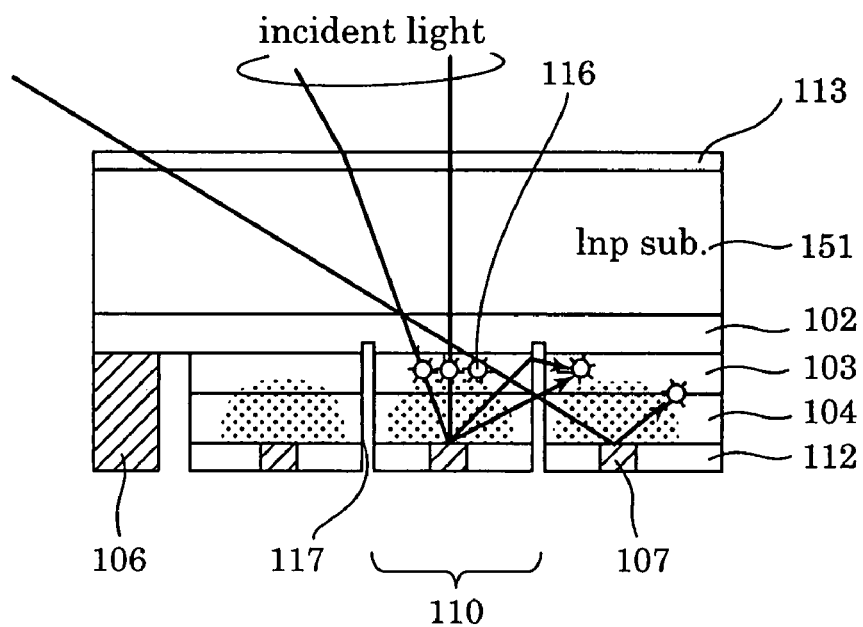

PHOTODETECTOR

BACKGROUND OF THE INVENTION

1. Field of the Invention

The present invention relates to a photodetector in which a plurality of photodiodes are disposed.

2. Description of the Background Art

With the increased interest in image sensors, image disturbance caused by light crosstalk between photodiodes (straying of light incident on a photodiode into adjacent photodiodes) is giving rise to problems (refer to Masatoshi Ishihara et al., "InGaAs Linear Image Sensor for Near-Infrared Range and their applications", Light Application and Visual Science, Institute of Electrical Engineering of Japan, JN: Z0953A, Vol. LAV-00, No. 7-13, pp. 31-36 (2006/10/26); Non-patent Reference 1). As shown in FIG. 23, in a photodetector 150, a p-electrode 107 of each photodiode and an n-electrode 106 are electrically connected to a multiplexer 135 via In solder 134. In this structure, crosstalk corresponds to the following phenomenon. As shown in FIG. 24, light incident on a photodiode 110 is received by a light-receiving portion 116 and converted into a current. A part of the light passes through the light-receiving portion 116 and is reflected by a p-electrode 107 located in the center of the mounting surface side of the photodiode and is also received by the light-receiving region of an adjacent photodiode. In the photodetector 150 shown in FIG. 24, photodiodes 110 are mounted epitaxial-side-down. The crosstalk phenomenon occurs in the same manner when photodiodes 110 are mounted epitaxial-side-up. In the photodetector, an anti-reflection film (AR film) 113 is disposed on the top surface of an InP substrate 151, and on the bottom side, i.e., on the mounting side, a structure of n-type buffer layer 102/absorption layer 103/InP window layer 104/p-electrode 107 and SiN passivation film 112 is disposed. FIG. 25 shows a photodetector 150 provided with photodiodes 110 epitaxial-side-up mounted. In this photodetector, crosstalk also occurs, in which light received by a photodiode 110 is also received by adjacent photodiodes. As a result of such crosstalk, a signal current is generated between adjacent photodiodes (pixels), and resolution is degraded. With respect to the photodetector 150 shown in FIG. 24, description will be made in detail below in DETAILED DESCRIPTION OF THE INVENTION. In the photodetector described above, as the pitch of the arrayed photodiodes decreases, degradation in resolution becomes more significant. Consequently, it is not possible to increase the number of pixels in a sensor having a certain size. When the number of pixels is increased, it is necessary to increase the chip size, which results in an increase in cost and which runs counter to miniaturization.

In order to reduce light crosstalk between pixels, a structure has been proposed in which a separation groove is provided between adjacent photodiodes and a metal film is disposed therein to block crosstalk between the adjacent photodiodes (refer to Japanese Unexamined Patent Application Publication No. 2005-123217, Patent Reference 1). Furthermore, although not directly related to crosstalk, a proposal has been made in which, in a near infrared photodiode array structure, photodiodes are disposed in an integrated manner on an integrated circuit to increase the light-receiving area, and thus to increase sensitivity (refer to Japanese Unexamined Patent Application Publication No. 11-354762, Patent Reference 2).

In the structure in which the separation groove and the metal film are provided between adjacent photodiodes, although light crosstalk can be reduced to a certain degree, since light propagates through the semiconductor substrate freely, light subjected to multiple reflections through the semiconductor substrate strays into adjacent photodiodes. Consequently, it is not possible to suppress crosstalk sufficiently. Furthermore, in the structure described above, since an insulation film is provided between photodiodes and a metal film is disposed thereon, consistency of quality required for the insulation film (reliability requirement) is significantly high. Therefore, for example, the presence of even a single pinhole or the like in the insulation film causes electrical short, thus causing a failure in function as a photodiode. Furthermore, the decrease in yield and the increase in cost are not negligible. In the structure in which photodiodes are disposed in an integrated manner on an integrated circuit, although the photodiodes are isolated from each other, free passage of scattered light is allowed. Thus, the problem of crosstalk is not solved.

If the crosstalk occurs, resolution between pixels is degraded. As the pitch between photodiodes is decreased, crosstalk increases significantly, and it becomes difficult to dispose pixels within a limited area. Furthermore, if the pitch between photodiodes is increased and the number of pixels is increased, the chip size increases as described above, resulting in an increase in cost.

SUMMARY OF THE INVENTION

It is an object of the present invention to provide a photodetector having a mechanism of suppressing light crosstalk.

A photodetector of the present invention includes a plurality of photodiodes disposed on a common semiconductor substrate, each photodiode including an absorption layer epitaxially grown on the common semiconductor substrate and being provided with an epitaxial-side electrode, wherein each photodiode is provided with at least one of a ring-shaped or crescent-shaped epitaxial-side electrode, an incident-side-limited condensing part which condenses incident light that is directed to the corresponding photodiode only, and emission means which is disposed on a side opposite to a light-incident side of the absorption layer and which allows light entering from the light-incident side to be easily emitted out of the photodiode.

In the structure described above, at least one of the ring-shaped or crescent-shaped epitaxial-side electrode, the incident-side-limited condensing part, and the emission means is provided. Consequently, in the case (R1) of epitaxial-side-down mounting in which the epitaxial-side electrode is disposed on the side opposite to the light-incident side, the ring-shaped or crescent-shaped epitaxial-side electrode, which is disposed so as to surround the photodiode, does not allow light passing through the absorption layer to be reflected so that reflected light does not reach the absorption layer of the adjacent photodiode. In the case (R2) of epitaxial-side-up mounting in which the epitaxial-side electrode is disposed on the light-incident side, the amount of light directed to the adjacent photodiode is decreased. Consequently, both in the case (R1) and in the case (R2), crosstalk can be suppressed. The incident-side-limited condensing part condenses light entering the light-incident side of the photodiode to direct incident light toward the absorption layer and decrease the amount of light that is directed toward the absorption layer of the adjacent photodiode. Furthermore, when the emission means which is disposed on the side opposite to the light-incident side of the absorption layer and which allows light that is not absorbed by the absorption layer to be easily emitted out of the photodiode, it is possible to prevent light that passes through a certain path from being received by two different photodiodes. Consequently, on the incident side of the absorption layer, the amount of light directed only to the absorption layer of the photodiode can be increased. On the back side of the absorption layer, for example, in the case of epitaxial-side-down mounting (in the case R1), the amount of light received by the adjacent photodiode can be suppressed by the ring-shaped or crescent-shaped epitaxial-side electrode. Similarly, the emission means on the back side of the absorption layer can prevent light passing through one path from being received by two different photodiodes. Since one of the incident-side-limited condensing part, the ring-shaped or crescent-shaped epitaxial-side electrode, and the emission means alone can suppress crosstalk by the function described above, any one of the above may be provided. Furthermore, in order to reduce crosstalk more reliably, any two of the above, or all three may be provided.

Furthermore, a structure may be employed in which the photodetector is of epitaxial-side-down mounting type, and the ring-shaped epitaxial-side electrode is provided on an epitaxial layer side opposite to the light-incident side. Thereby, on the mounting surface side, the ring-shaped epitaxial-side electrode can prevent light from scattering toward the absorption layer of the adjacent photodiode. Herein, the term "side opposite to the light-incident side" refers to the mounting side.

Furthermore, a structure may be employed in which the photodetector is of epitaxial-side-up mounting type, the ring-shaped epitaxial-side electrode is provided on the light-incident side, and a ring-shaped substrate-side electrode is provided on a back surface (mounting side) of the semiconductor substrate so as to surround a region corresponding to the plurality of photodiodes. Thereby, on the light-incident side, light proceeding toward adjacent photodiodes can be suppressed by the epitaxial-side electrode, and on the mounting side, light scattering by the substrate-side electrode toward adjacent photodiodes can be suppressed.

An anti-reflection film may be provided on a surface opposite to the light-incident side of the photodiode. Thereby, it is possible to prevent light from being reflected at the interface between the passivation film on the mounting substrate side of the photodiode and the outside air and being scattered toward the absorption layer of the adjacent photodiode. The emission means described above may be any optical component that is capable of allowing light to be easily emitted out to the outside, and may be an anti-reflection film as described above. The position at which the anti-reflection film is disposed is on the mounting side (bottom side). The anti-reflection film can be used for both the epitaxial-side-down mounting type and the epitaxial-side-up mounting type.

Furthermore, a lens may be disposed on a surface of the epitaxial layer of the photodiode. In such a structure, it is possible to prevent light from being reflected at the interface between the passivation film and the outside air and being scattered toward the absorption layer of the adjacent photodiode. The emission means described above may be any optical component that is capable of allowing light to be easily emitted out to the outside, and may be a lens as described above. The position at which the lens is disposed is on the mounting side (bottom side). The lens can be used for both the epitaxial-side-down mounting type and the epitaxial-side-up mounting type.

A structure may be employed in which the photodiodes are mounted epitaxial-side-down, and the incident-side-limited condensing part is a dent region provided on each photodiode at the light-incident surface of the semiconductor substrate. Thereby, it is possible to more easily condense light that is directed closer to the vertical direction (the depth direction of the dent region). Since light directed closer to the vertical direction is not easily reflected at the interface between the passivation film and the outside air, light does not easily stray into the absorption layer of the adjacent photodiode.

In the light-incident surface of the semiconductor substrate of the photodiodes, exposed surfaces other than the bottom surfaces of the dent regions may be covered with a light-shielding layer that does not transmit light. In such a structure, it is possible to condense only light with an incident angle closer to the vertical than the angle determined by the size (planar size and depth) of the dent region. Thereby, it is possible to more reliably suppress light that is scattered toward adjacent photodiodes.

The light-shielding layer may be a metal film. In such a structure, the light-shielding layer can be produced easily using a metal film. Any metal film that does not transmit light may be used. For example, it is possible to use a monolayer film (single metal film or alloy film) containing Ti, Cr, Co, Ni, Fe, Zn, Mo, W, Au, Al, Ag, Pt, or the like, or a laminating layer thereof, which can be easily formed with known film-forming equipment.

The light-shielding layer may be a light-absorbing film. In such a structure, it is possible to condense only light with an incident angle closer to the vertical than the angle determined by the size of the dent region strictly compared with the case described above. Any light-absorbing film that absorbs light may be used. Examples thereof include a semiconductor film or semiconductor powder that has a larger bandgap wavelength than the wavelength of light to be received, and a film that can serve as a black body, such as a carbon film.

The light-shielding layer may be a light reflection film. In such a structure, it is possible to produce the light-shielding layer easily. Any light reflection film that reflects light may be used. For example, with respect to short-wave infrared (SWIR) light, a multilayer film composed of Si and $SiO_2$, a multilayer film composed of $Al_2O_3$ and Si, or the like can be used.

In the light-incident surface of the semiconductor substrate of the photodiodes, exposed surfaces other than the bottom surfaces of the dent regions may be subjected to treatment to prevent light transmission. Thereby, the same effect as that in the case where the light-shielding layer is provided can be obtained even if a new film is not provided.

Furthermore, a gradient refractive index layer may be embedded in each dent region so that the refractive index is low at the light-incident side and the refractive index is high at the bottom side. In such a structure, since the refractive index increases from the outside air toward each photodiode, incident light is further refracted toward the vertical direction in the gradient refractive index layer, and light proceeding toward the adjacent photodiode can be suppressed.

Furthermore, the incident-side-limited condensing part may be composed of an optical element located above the light-incident surface of each photodiode. Thereby, light proceeding toward the absorption layer of the adjacent photodiode can be suppressed.

The optical element may be a lens. In such a structure, it is possible to direct incident light toward the absorption layer of the corresponding photodiode by the lens which is a simple optical element.

The optical element may be a diffraction grating. In such a structure, by adjusting the components of the diffraction grating to the intended use, it is possible to more reliably direct light in a direction closer to the vertical ingredient for entry.

The optical element may have a structure including a photonic crystal. Thereby, the photodiode itself is processed, and it is possible to more reliably direct light in a direction closer to the vertical ingredient for entry.

The incident-side-limited condensing part may be an optical component having a multilayer structure. In the multilayer structure, incident light having an incident angle exceeding a predetermined angle with respect to the photodiode is reflected, and incident light having an incident angle equal to or smaller than the predetermined angle is condensed to the absorption layer. Thereby, it is possible to allow only light having an incident angle closer to the vertical than the predetermined angle to enter without formation of the dent regions or film deposition on the dent regions. The predetermined threshold angle varies depending on the properties of materials constituting the multilayer structure and also varies depending on the properties (in particular, refractive index) of the material (air or the epitaxial film constituting the photodiode body) in contact with the multilayer structure.

The optical component may be an anti-reflection film having a multilayer structure placed on the light-incident surface. In such a structure, it is possible to allow only light with an incident angle closer to the vertical than the angle determined by the size of the dent region to easily enter.

The optical component may be an epitaxial multilayer film provided between the light-incident surface and the absorption layer. In such a structure, with a very small increase in production cost, it is possible to easily, allow only light with an incident angle closer to the vertical than the angle determined by the size of the dent region to enter. In such a case, the growth time of the epitaxial multilayer film and the material cost are only slightly increased compared with the case where the epitaxial multilayer film is not provided.

A structure may be employed in which the photodiodes are mounted epitaxial-side-down, and an epitaxial multilayer film, as an optical component having a multilayer structure, is disposed between the light-incident surface of the semiconductor substrate and a buffer layer disposed on the semiconductor substrate. Thereby, it is possible to more easily allow only light with an incident angle closer to the vertical than the angle determined by the size of the dent region to enter. In the case of flip-chip mounting, since the epitaxial multilayer film is located at a position in which a current generated by light does not flow, the photodiode resistance or the like is not affected, and crosstalk can be suppressed at low cost.

A structure may be employed in which the photodiodes are mounted epitaxial-side-down, and an epitaxial multilayer film, as an optical component having a multilayer structure, is a buffer layer disposed on the semiconductor substrate. In such a structure, since two functions, namely, the buffer layer for enhancing crystallinity of the absorption layer and the anti-reflection film for suppressing crosstalk, are provided, an increase in production cost can be minimized.

A structure may be employed in which the photodiodes are mounted epitaxial-side-down, and an epitaxial multilayer film, as an optical component having a multilayer structure, is disposed between a buffer layer disposed on the semiconductor substrate and the absorption layer on the buffer layer. In such a structure, since the epitaxial multilayer film is provided directly above the absorption layer, it is possible to allow light having a wider incident angle to enter the absorption layer compared with the case where the epitaxial multilayer film is provided as the buffer layer or between the buffer layer and the semiconductor substrate.

Furthermore, in any of the photodetectors described above, the photodetector may be used to detect light in the wavelength range of 1.0 to 3.0 μm, the semiconductor substrate may be composed of an InP substrate, the bandgap wavelength of the absorption layer may be in the range of 1.65 to 3.0 μm, and the absorption layer may be composed of at least one of GaInNAsP, GaInNAsSb, and GaInNAs. Thereby, it is possible to produce a SWIR detector having low crosstalk.

In the photodetector of the present invention, since photodiodes, each provided with at least one of the ring-shaped epitaxial-side electrode and the incident-side-limited condensing part, are arrayed, it is possible to limit the light path in which light received by a photodiode strays into an adjacent photodiode and is received thereby, and it is also possible to exclude light that is incident on the photodiodes with a large inclination angle. As a result, it is possible to greatly improve crosstalk characteristics of the photodetector.

BRIEF DESCRIPTION OF THE DRAWINGS

FIG. 23 is a sectional view showing a conventional photodetector;

FIG. 24 is a sectional view showing a conventional photodetector according to a comparative example.

DETAILED DESCRIPTION OF THE INVENTION

First Embodiment

Figure 1:
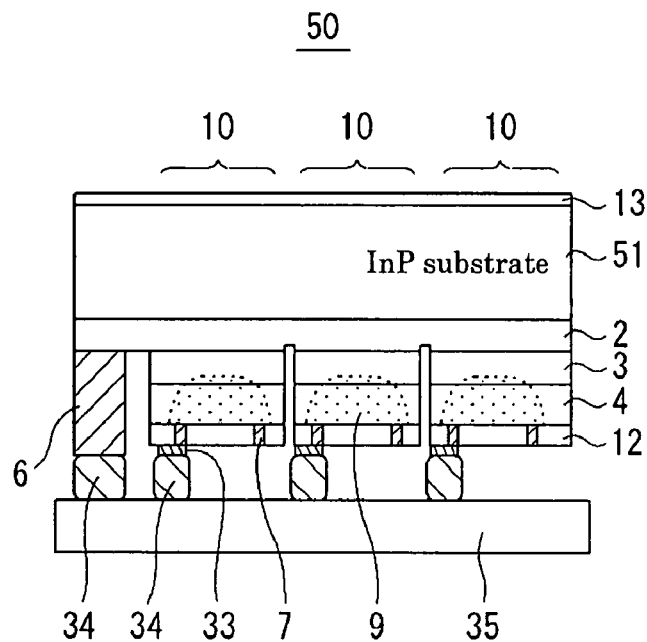
FIG. 1 is a sectional view showing a photodetector according to a first embodiment of the present invention.
Figure 2:
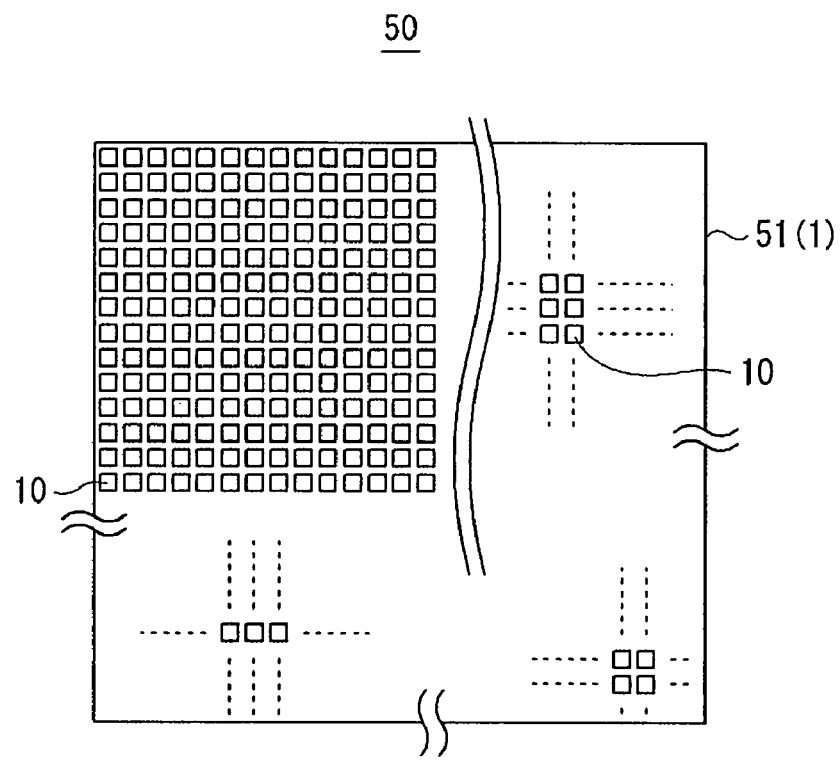
FIG. 2 is a schematic diagram showing a photodiode array of the photodetector shown in FIG. 1.
Figure 3:
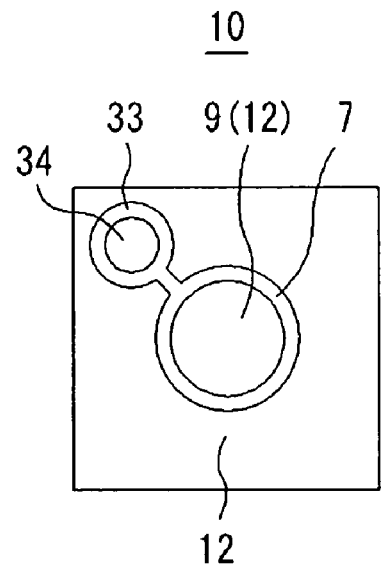
FIG. 3 is a schematic diagram showing a photodiode in the photodiode array shown in FIG. 2.

FIG. 1 is a sectional view showing a photodetector according to a first embodiment of the present invention. In a photodetector 50, an AR film 13 is disposed on the top side of an InP substrate 51, and an epitaxial layer including an absorption layer 3 for each photodiode 10 is disposed on the bottom side, i.e., the mounting side. The p-electrode to be used may be ring-shaped or crescent-shaped. In this embodiment, a ring-shaped p-electrode 7 is disposed so as to be exposed from a SiN passivation film 12. An electrode wire 33 is extracted from the p-electrode 7, and thus the p-electrode 7 and an n-electrode 6 are connected to wires of a multiplexer 35 via InP solder 34. Signals from each photodiode 10 are processed by the multiplexer 35 for image formation. FIG. 2 is a schematic diagram showing a photodiode array according to the first embodiment of the present invention. Hereinafter, description will be omitted on the multiplexer, the InP solder, etc., because they are hardly related to crosstalk, and phenomena inside the photodiode array will be described. Consequently, the photodetector 50 may sometimes be called as a photodiode array. FIG. 3 is a schematic diagram showing a photodiode in the photodiode array 50 shown in FIG. 2. Referring to FIG. 2, the photodiodes 10 of the photodiode array 50 are provided on a common InP substrate 51 (1). Current signals produced by receipt of incident light in the individual photodiodes are, for example, transmitted to a multiplexer which also serves as a mounting substrate, and image formation processing is performed, and thus an image is formed. The number of pixels is changed by changing the size of each photodiode, the pitch, and the size of the array. The photodiode array 50 shown in FIG. 2 has 90,000 pixels. A photodiode 10 shown in FIG. 3 includes a plurality of epitaxial layers formed on the InP substrate 1 (51), and a p-type region 9 is disposed on the epitaxial layer side. The p-type region 9 may be ring-shaped or crescent-shaped. FIG. 3 shows a ring-shaped p-type region 9. The p-type region 9 is formed in a SiN passivation film 12 and is electrically connected to the electrode wire 33. The electrode wire 33 is connected to the wire of the multiplexer via In solder 34. This embodiment is characterized in that the p-electrode 7 has a ring shape as described above.

Figure 4:
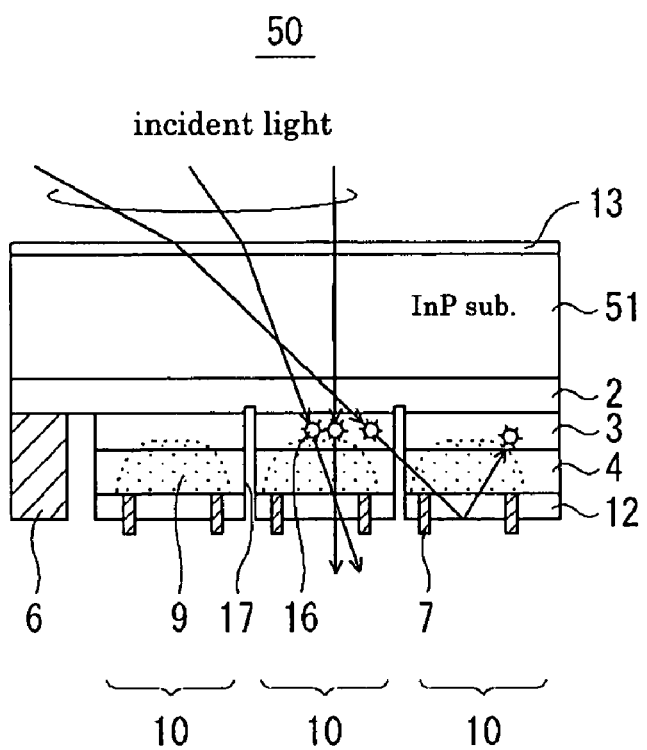
FIG. 4 is a sectional view of the photodetector shown in FIG. 2.

FIG. 4 is a sectional view showing a photodetector 50 provided with photodiodes 10 which are mounted epitaxial-side-down (flip-chip mounted). The photodiodes 10 are disposed on a common n-type InP substrate 51 and isolated from adjacent photodiodes by means of separation grooves 17. Each photodiode has a structure including n-type InP buffer layer 2/In$_{0.53}$Ga$_{0.47}$As absorption layer 3/InP window layer 4/p-electrode 7 and passivation film 12 disposed in that order on the InP substrate. Electrode wires for connection to the multiplexer are omitted in FIG. 4 and subsequent figures. An anti-reflection (AR) film 13 is provided on the surface of the InP substrate 51 on the light-incident side in epitaxial-side-down mounting. Since the refractive index of InP is large at 3 or more, incident light is slightly refracted when entering the photodiode. The p-type region 9 extends from the InP window layer 4 to the inside of the absorption layer 3. An n-electrode 6 is provided on the n-type InP buffer layer 2. The p-electrode 7, which is an epitaxial-side electrode, is formed into a ring shape in contact with the p-type region 9 located on the mounting surface side.

In the photodiodes described above, an example is shown in which an InP substrate is used as the semiconductor substrate, an InP layer is used as the buffer layer, an In$_{0.53}$Ga$_{0.47}$As layer is used as the absorption layer, and an InP layer is used as the window layer. In view of the nature of the present invention, the materials for the photodiode are not limited to those described in the example, and any materials may be used for the photodiodes. In the embodiments describe below, other than this embodiment, unless otherwise stated, any materials may be used for photodiodes. Furthermore, the wavelength range of light to be received is not limited.

The photodiodes described above are fabricated by a method described below. For example, on a 2-inch square, a S-doped, n-type InP substrate 1, an n-type InP buffer layer 2 (d=2 μm), an In$_{0.53}$Ga$_{0.47}$As layer 3 doped with a very small amount of Si (carrier concentration 1×10$^{16}$ cm$^{-3}$, d=3 μm), and a non-doped InP window layer 4 (d=1.5 μm) are epitaxially grown in that order by an organometallic vapor phase epitaxy (OMVPE) method or the like. The epitaxial growth temperature is set at 520° C. As starting materials, trimethyl indium (TMIn), triethyl gallium (TEGa), tertiary butyl arsine (TBAs), tertiary butyl phosphine (TBP), dimethylhydrazine (DMHy), and tetraethylsilane (TESi) are used.

In the photodetector 50 shown in FIG. 4, light entering a p-type region 9 of the absorption layer at an incident angle close to the vertical is received by a light-receiving portion 16 and passes through inside the ring of the p-electrode 7, which is a ring-shaped epitaxial-side electrode. Consequently, the light does not easily stray into the adjacent photodiode due to reflection by the p-electrode 7. However, light entering at an incident angle which is largely inclined is received by the light-receiving portion 16 of the photodiode 10, then strays into the adjacent photodiode so as to graze through the p-type region 9 thereof, and is reflected, for example, by the back surface (epitaxial-side surface). The light reflected by the back surface may be received by the light-receiving portion 16 of the adjacent photodiode. In the photodiode shown in FIG. 4, although crosstalk is certainly improved, there is still a room for improvement.

(Modification Example 1 of Photodetector shown in FIG. 4)

Figure 5:
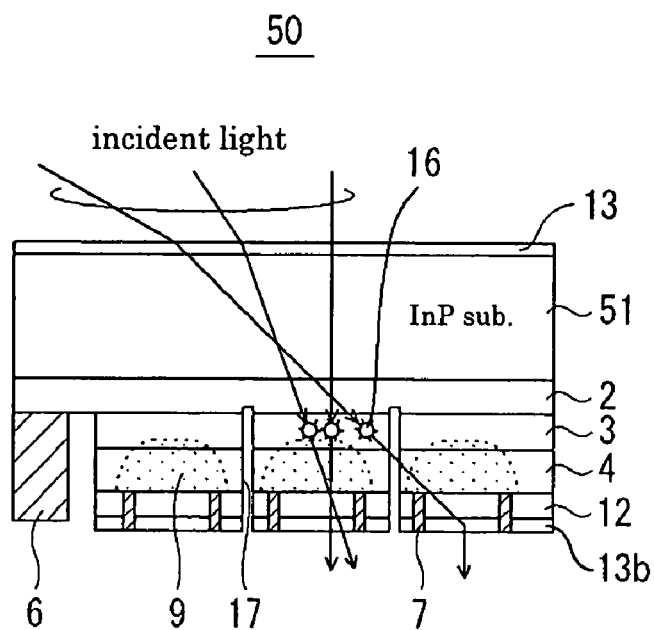
FIG. 5 is a sectional view showing Modification Example 1 of the photodetector shown in FIG. 4.

FIG. 5 is a sectional view showing Modification Example 1 of the photodetector according to the first embodiment of the present invention shown in FIG. 4. A photodetector 50 in Modification Example 1 is characterized in that an AR film 13b which is emission means is further provided on a passivation film 12 on the epitaxial layer side. Because of the presence of the AR film 13b disposed on the surface (mounting side or epitaxial-side in epitaxial-side-down mounting) opposite to the light-incident surface, even if light that has entered at an incident angle that is greatly inclined is received by the light-receiving portion 16 of the photodiode 10 and then strays into the adjacent photodiode so as to graze through the p-type region 9 thereof, the light is not reflected by the back surface and passes through the back surface. Consequently, in comparison with the photodetector shown in FIG. 4, since no reflection occurs at the back surface, crosstalk can be suppressed more reliably.

(Modification Example 2 of Photodetector Shown in FIG. 4)

Figure 6:
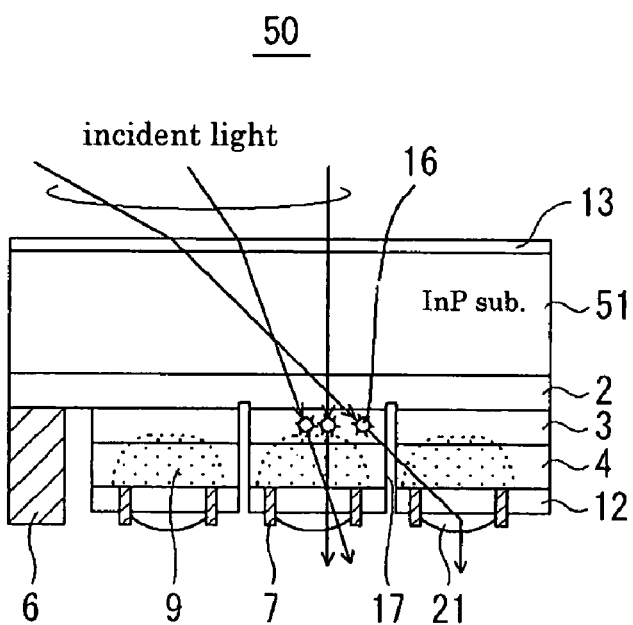
FIG. 6 is a sectional view showing Modification Example 2 of the photodetector shown in FIG. 4.

FIG. 6 is a sectional view showing Modification Example 2 of the photodetector according to the first embodiment of the present invention shown in FIG. 4. A photodetector 50 in Modification Example 2 is characterized in that a lens 21 which is emission means is disposed inside the ring of each ring-shaped epitaxial-side electrode 7. Because of the presence of the lens 21 disposed on the surface opposite to the light-incident surface, even if light that has entered at an incident angle that is greatly inclined is received by the light-receiving portion 16 of the photodiode 10 and then strays into the adjacent photodiode so as to graze through the p-type region 9 thereof, the light is not reflected by the back surface and passes through the region of the lens 21. Consequently, in comparison with the photodetector shown in FIG. 4, since no reflection occurs at the back surface, crosstalk can be suppressed more reliably.

Second Embodiment

Figure 7:
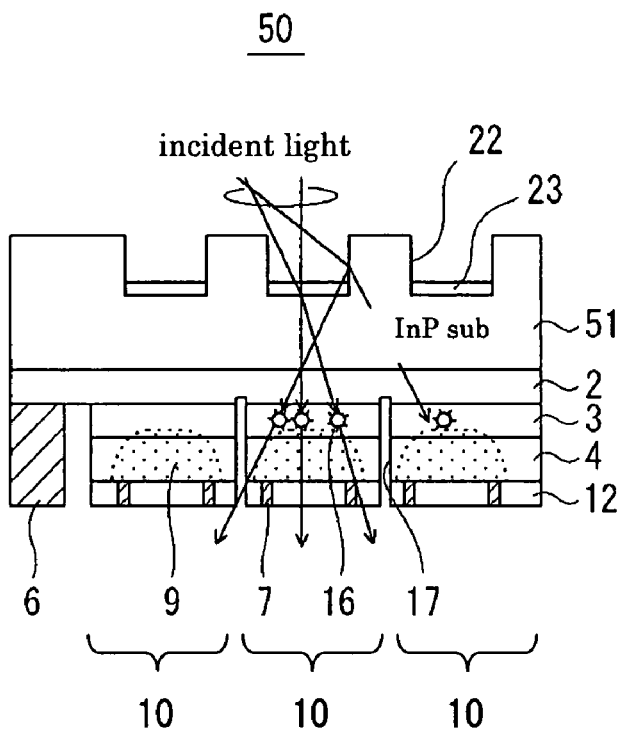
FIG. 7 is a sectional view showing a photodetector according to a second embodiment of the present invention.

FIG. 7 is a sectional view showing a photodetector according to a second embodiment of the present invention. A photodetector 50 includes an array of epitaxial-side-down mounted (flip-chip mounted) photodiodes 10. The photodiodes 10 are disposed on a common n-type InP substrate 51, and isolated from adjacent photodiodes by means of separation grooves 17. Each photodiode has a structure including n-type InP buffer layer 2/absorption layer 3/InP window layer 4/passivation film 12 disposed in that order on the InP substrate. This embodiment is characterized in that a dent region 22 is provided in the center of the photodiode on the surface of the InP substrate 51 on the light-incident side in epitaxial-side-down mounting, and an AR film 23 is disposed on the bottom surface of the dent region. The dent region 22 corresponds to an incident-side-limited condensing part. An n-electrode 6 is provided on the n-type InP buffer layer 2, thus enabling flip-chip mounting. Each p-electrode 7, which is an epitaxial-side electrode, is formed into a ring shape in contact with the p-type region 9 located on the mounting surface side as in the first embodiment.

In the photodetector 50 shown in FIG. 7, light entering the p-type region 9 of the absorption layer at an incident angle close to the vertical passes through the AR film 23 at the bottom of the dent region 22, is received by a light-receiving portion 16 in the absorption layer, and passes through inside or outside the ring of the ring-shaped electrode 7. Consequently, the light does not easily stray into the adjacent photodiode due to reflection by the p-electrode. However, light entering at an incident angle which is largely inclined hits and is reflected by the sidewall surface of the dent region 22 or enters from the sidewall surface. Among the light beams reflected, the light beams passing through the AR film 23 at the bottom of the dent region are received by the light-receiving portion of the photodiode and often pass therethrough. On the other hand, the light that is refracted at and enters from the sidewall surface is received by the adjacent photodetector, thus causing crosstalk. In the photodiodes shown in FIG. 7, although crosstalk is greatly improved, there is still a room for improvement.

(Modification Example 1 of Photodetector Shown in FIG. 7)

Figure 8:
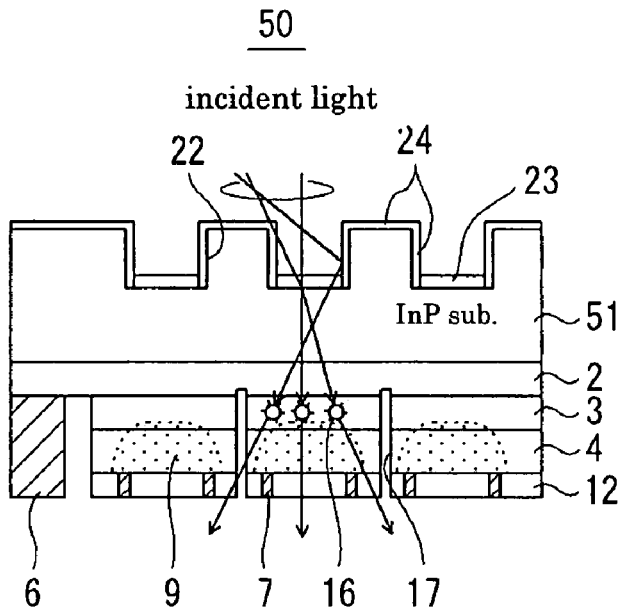
FIG. 8 is a sectional view showing Modification Example 1 of the photodetector shown in FIG. 7.

FIG. 8 is a sectional view showing Modification Example 1 of the photodetector according to the second embodiment of the present invention shown in FIG. 7. A photodetector 50 in Modification Example 1 is characterized in that sidewall surfaces and top surfaces (exposed surfaces other than bottom surfaces) of dent regions 22 in an InP substrate 51 are covered with a light-shielding film 24 that does not transmit light. The light-shielding film 24 may be a high reflection (HR) film, a metal film, or a light-absorbing film. Because of the presence of the light-shielding film 24 covering the exposed surfaces other than the bottom surfaces of the dent regions, for example, at the sidewall surface of a dent region 22, light entering at an incident angle which is largely inclined is reflected by the light-shielding film 24, such as a reflection film or a metal film, passes through the AR film 23 at the bottom of the dent region, is received by the corresponding photodiode, and passes therethrough. Consequently, even largely inclined incident light is not directed toward the adjacent photodiode from the sidewall of the dent region 22 and is received by the corresponding photodiode. Thus, in comparison with the photodetector shown in FIG. 7, it is possible to suppress crosstalk more reliably. As the metal film, any material that does not transmit light may be used. For example, it is possible to use a monolayer film (single metal film or alloy film) containing Ti, Cr, Co, Ni, Fe, Zn, Mo, W, Au, Al, Ag, Pt, or the like, or a laminating layer thereof, which can be easily formed with known film-forming equipment. As the light-absorbing film, any material that absorbs light may be used. Examples thereof include a semiconductor film or semiconductor powder that has a larger bandgap wavelength than the wavelength of light to be received, and a film that can serve as a black body, such as a carbon film. As the light reflection film, any material that reflects light may be used. For example, with respect to SWIR light, a multilayer film composed of Si and $SiO_2$, a multilayer film composed of $Al_2O_3$ and Si, or the like can be used.

(Modification Example 2 of Photodetector Shown in FIG. 7)

Figure 9:
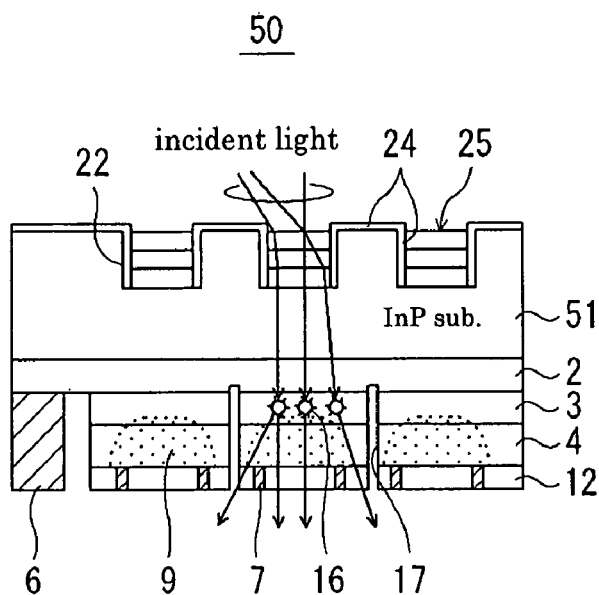
FIG. 9 is a sectional view showing Modification Example 2 of the photodetector shown in FIG. 7.

FIG. 9 is a sectional view showing Modification Example 2 of the photodetector according to the second embodiment of the present invention shown in FIG. 7. A photodetector 50 in Modification Example 2 is characterized in that "a gradient refractive index layer 25 in which the refractive index is low at the light-incident side and the refractive index is high at the bottom side" is embedded in each dent region 22 in an InP substrate 51. Exposed surfaces other than bottom surfaces of the dent regions, i.e., sidewall surfaces and top surfaces, are covered with a light-shielding film 24 as in Modification Example 1 shown in FIG. 8. Consequently, Modification Example 2 is also a modification example with respect to Modification Example 1 described above.

By embedding the gradient refractive index layer 25 in each of the dent regions 22, light entering at an incident angle which is largely inclined has its propagation direction changed so as to be closer to the vertical direction by the effect of the gradient refractive index layer 25. This is the natural result of the fact that the refractive index increases toward the bottom. Furthermore, light entering at an incident angle that is close to the vertical direction propagates while its propagation direction is being brought close to the vertical direction, and is received by the corresponding photodiode. Consequently, when incident on the gradient refractive index layer, even incident light with an incident angle which is largely inclined has its propagation direction changed so as to be closer to the vertical direction, and is not directed to the adjacent photodiode. Since the light is received by the corresponding photodiode, it is possible to suppress crosstalk reliably compared with the photodetector shown in FIG. 7.

Figure 10:
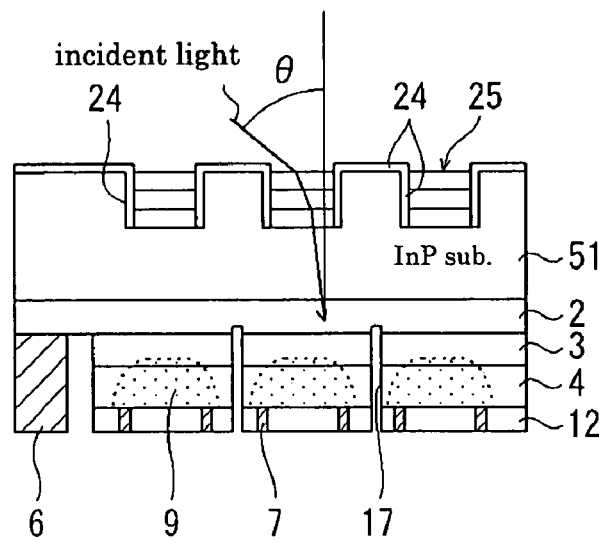
FIG. 10 is a sectional view explaining the effect of a gradient refractive index layer in Modification Example 2 shown in FIG. 9.

As the structure of the gradient refractive index layer, any combination of layers that do not absorb light significantly and that have different refractive indices may be used. For example, in the case of incidence of light on InP used for SWIR photodiodes, the following structure of the gradient refractive index layer may be used (refer to FIG. 10): (Gradient refractive index layer R1); (Air: outside)/$SiO_2$ (refractive index 1.5)/SiON (refractive index 1.8)/(InP: photodiode substrate) (Gradient refractive index layer R2); (Air: outside)/

Epoxy resin (refractive index 1.6)/SiON (refractive index 1.8)/(InP: photodiode substrate)

In the case of the gradient refractive index layer R1, with respect to light entering the photodiode at an angle θ (angle to the standard vertical line) of 60°, the angle is shifted more vertically to 35° in $SiO_2$, 29° in SiON, and 17° in InP. In the case of the gradient refractive index layer R2, with respect to light entering the photodiode at 60°, the angle can also be brought closer to the vertical, i.e., shifted to 33° in the epoxy resin, 29° in SiON, and 17° in InP. As a result, by using the gradient refractive index layer 25, it is possible to suppress crosstalk.

(Modification Example 3 of Photodetector Shown in FIG. 7)

Figure 11:
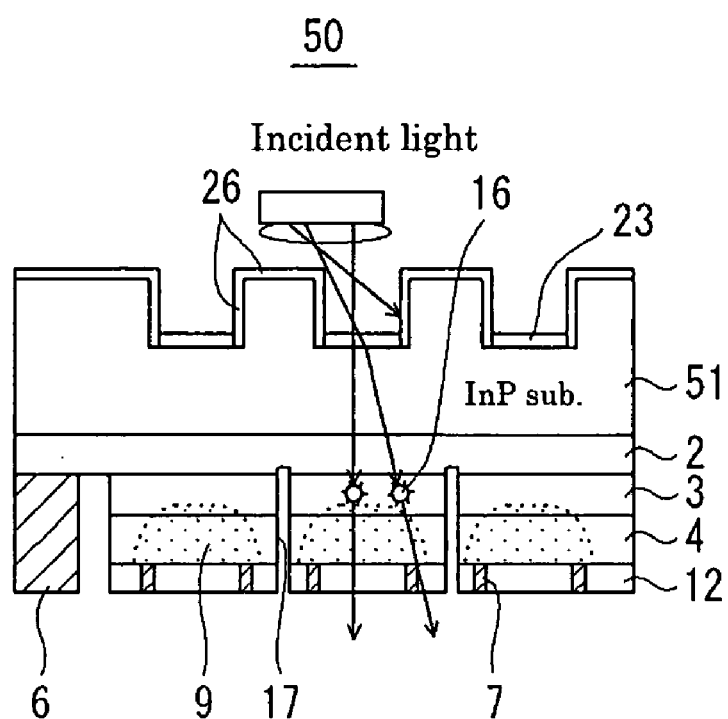
FIG. 11 is a sectional view showing Modification Example 3 of the photodetector shown in FIG. 7.

FIG. 11 is a sectional view showing Modification Example 3 of the photodetector according to the second embodiment of the present invention shown in FIG. 7. A photodetector 50 in Modification Example 3 is characterized in that sidewall surfaces and top surfaces (exposed surfaces other than bottom surfaces) of dent regions 22 in an InP substrate 51 are covered with a treated layer 26 that is treated so as not to transmit light. The treated layer 26 is subjected to treatment for prevention of light transmission. Any treatment, such as opacifying treatment in which a fine uneven surface is formed, may be used. Examples of the treatment method for the treated layer 26 include a method in which the surface is machined using a dicer, a fine whetstone, or the like so that the surface has fine unevenness, a method for forming unevenness using wet etching or reactive ion itching, which depends on the material, and a method for forming unevenness in which the surface is oxidized or modified by heat treatment. For example, in the case of an InP substrate which is used as a substrate for SWIR photodiodes, it is possible to employ a method for forming unevenness in which P is partially eliminated from the surface by heat treatment. Because of the presence of the treated layer 26 covering the exposed surfaces other than the bottom surfaces of the dent regions, light entering at an incident angle which is largely inclined cannot pass, for example, through the sidewall surface of a dent region 22. Thus, incident light which is largely inclined cannot pass through the sidewall surface of the dent region 22, and does not proceed to the adjacent photodiode. Therefore, it is possible to suppress crosstalk reliably compared with the photodetector shown in FIG. 7.

Third Embodiment

Figure 12:
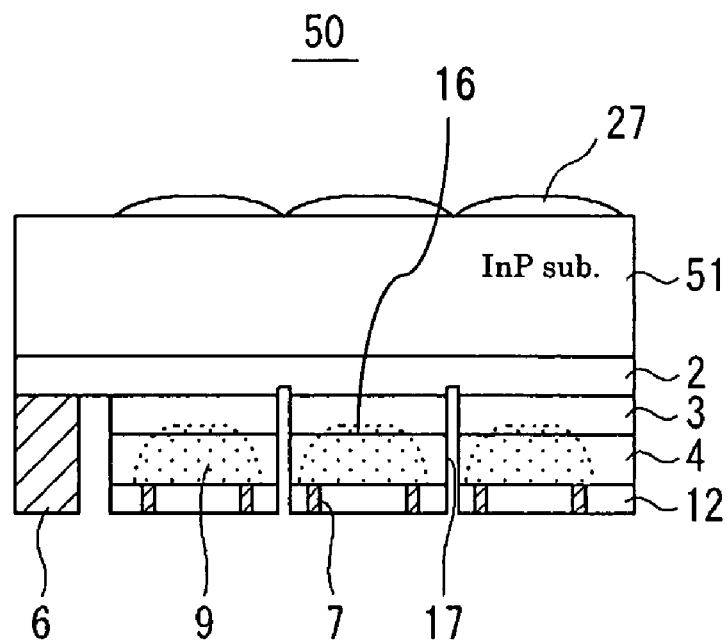
FIG. 12 is a sectional view showing a photodetector (lens arrangement) according to a third embodiment of the present invention.
Figure 13:
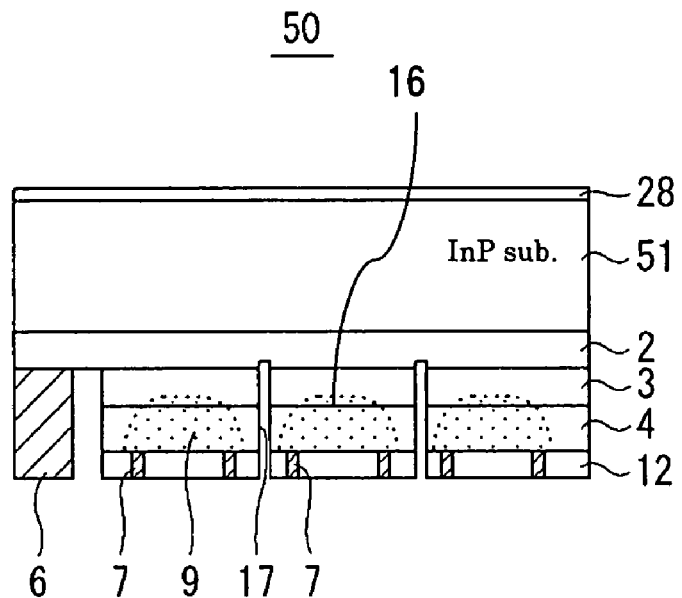
FIG. 13 is a sectional view showing a photodetector (diffraction grating arrangement) according to the third embodiment of the present invention.
Figure 14:
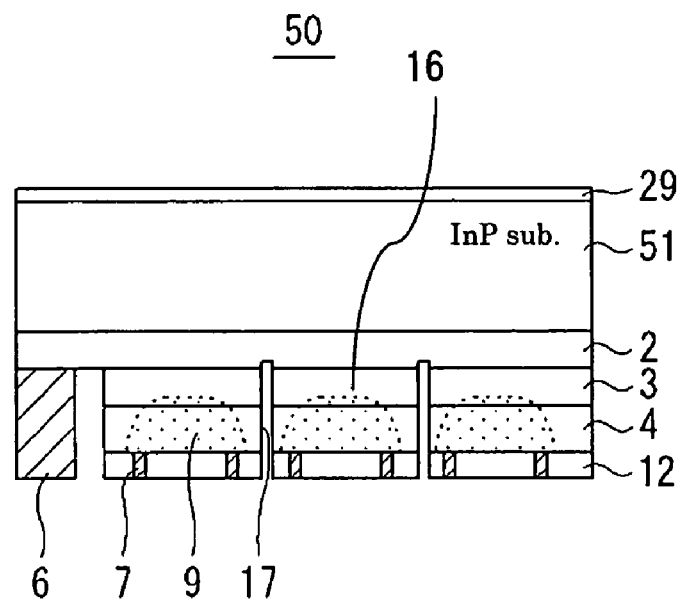
FIG. 14 is a sectional view showing a photodetector (photonic crystal arrangement) according to the third embodiment of the present invention.

FIGS. 12 to 14 are each a sectional view showing a photodetector according to a third embodiment of the present invention. A photodetector 50 includes an array of epitaxial-side-down mounted (flip-chip mounted) photodiodes 10. The photodiodes 10 are disposed on a common n-type InP substrate 51, and isolated from adjacent photodiodes by means of separation grooves 17. Each photodiode has a structure including n-type InP buffer layer 2/absorption layer 3/InP window layer 4/passivation film 12 disposed in that order on the InP substrate. This embodiment is characterized in that an optical element, which is an incident-side-limited condensing part, is disposed on the surface of the InP substrate 51, which is the light-incident surface in epitaxial-side-down mounting. In the photodetector shown in FIG. 12, the optical element is a lens 27. In FIG. 13, the optical element is a diffraction grating 28. In FIG. 14, a photonic crystal 29 is disposed. An n-electrode 6 is provided on the n-type InP buffer layer 2.

Each p-electrode 7, which is an epitaxial-side electrode, is formed into a ring shape in contact with the p-type region 9 located on the mounting surface side as in the second embodiment.

In each of the photodetectors 50 shown in FIGS. 12 to 14, light with an incident angle close to the vertical proceeds intact and is received by a light-receiving portion 16 in the absorption layer. With respect to light entering at an incident angle which is largely inclined, the propagation direction of the light is optically changed toward the vertical direction on the basis of the optical function of the optical element 27, 28, or 29. Consequently, even if the incident angle varies slightly, these incident light beams are received by the corresponding photodiode. Thus, crosstalk can be more reliably suppressed.

Fourth Embodiment

Figure 15:
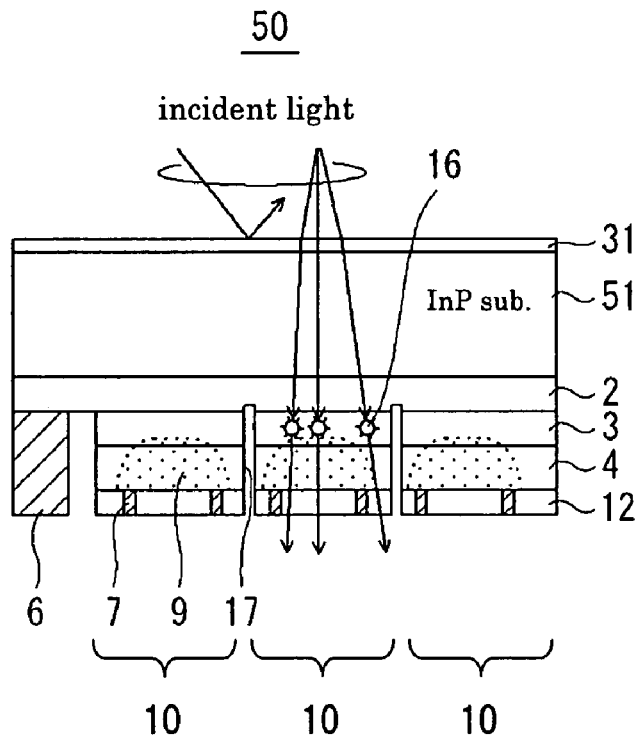
FIG. 15 is a sectional view showing a photodetector according to a fourth embodiment of the present invention.

FIG. 15 is a sectional view showing a photodetector according to a fourth embodiment of the present invention. A photodetector 50 includes an array of epitaxial-side-down mounted (flip-chip mounted) photodiodes 10. The photodiodes 10 are disposed on a common n-type InP substrate 51, and isolated from adjacent photodiodes by means of separation grooves 17. Each photodiode has a structure including n-type InP buffer layer 2/absorption layer 3/InP window layer 4/passivation film 12 disposed in that order on the InP substrate. This embodiment is characterized in that an AR multilayer film (AR film+multilayer film) 31 is provided on the surface of the InP substrate 51 at the light-incident side in epitaxial-side-down mounting, the AR multilayer film reflecting and not transmitting incident light which is largely inclined. The AR multilayer film 31 is an incident-side-limited condensing part. An AR film is necessary to allow light to efficiently enter the photodetector 50. By adding a multilayer film to the AR film, it is possible to select light beams depending on the incident angles with high accuracy. For example, Table below summarizes to what extent inclined incident light beams can be eliminated in the case (S1) of no AR film, the case (S2) of AR film only, and the case (S3) of AR multilayer film.

TABLE

| | | transmittance | |
|---|---|---|---|
| | structure | incident angle = 0 deg. vertical to the substrate | incident angle = 60 deg. |
| (S1) no AR film | air(outer)/InP(photodiode) | 75 | 73 |
| (S2) AR film only | air(outer)/AR film(*)/ InP(photodiode) | 90 | 80 |
| (S3) AR multilay film | air(outer)/AR film(*) + multilayer film(**)/ InP(photodiod | 90 | 30 |

(*)AR film: SiON 200 nm thick
(**)multilayer film: $SiO_2$/amorphous/$SiO_2$/amorphous/$SiO_2$/amorphous/$SiO_2$ As is evident from Table, in the case (S1) of no AR film or the case (S2) of AR film only, light with an incident angle of 60° is transmitted at a transmittance of 73% or 80%, while in the case (S3) of AR multilayer film, the transmittance is 30%. As a result, it has been confirmed that by using the AR multilayer film, crosstalk can be more reliably suppressed. An n-electrode 6 is provided on the n-type InP buffer layer 2.

Each p-electrode 7, which is an epitaxial-side electrode, is formed into a ring shape in contact with the p-type region 9 located on the mounting surface side as in the second embodiment.

In the photodetector 50 shown in FIG. 15, light entering the p-type region 9 of the absorption layer at an incident angle close to the vertical passes through the AR multilayer film 31, is received by a light-receiving portion 16 in the absorption layer, and passes through inside or outside the ring of the ring-shaped electrode 7. Consequently, the light does not easily stray into the adjacent photodiode due to reflection by the p-electrode. Furthermore, light entering with an incident angle which is largely inclined is reflected by the AR multilayer film 31 and does not enter the InP substrate 51. Consequently, only light that has an incident angle close to the vertical enters the InP substrate 51 and proceeds to the absorption layer of the photodiode. As a result, crosstalk is significantly improved. The function of the AR multilayer film in this embodiment is similar to the function of the dent regions in the second embodiment. However, in this embodiment, the function can be achieved by the formation of a multilayer film, which is a process simpler than the process of forming the dent regions.

(Modification Examples 1 to 3 of Photodetector Shown in FIG. 15)

Figure 16:
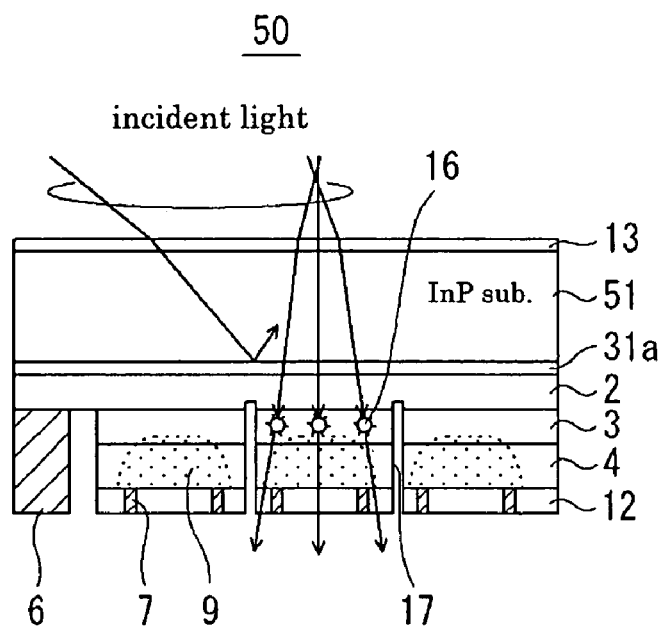
FIG. 16 is a sectional view showing Modification Example 1 of the photodetector shown in FIG. 15.
Figure 17:
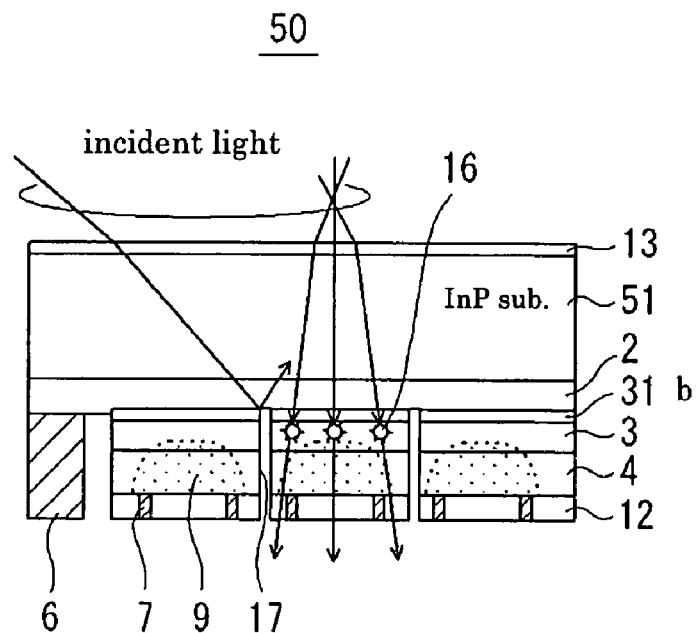
FIG. 17 is a sectional view showing Modification Example 2 of the photodetector shown in FIG. 15.
Figure 18:
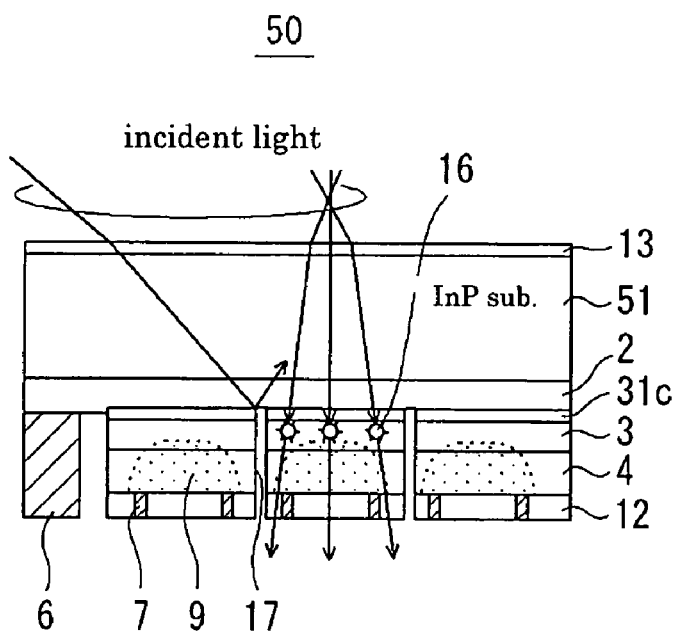
FIG. 18 is a sectional view showing Modification Example 3 of the photodetector shown in FIG. 15.

FIGS. 16 to 18 are sectional views respectively showing Modification Examples 1 to 3 of the photodetector shown in FIG. 15. Modification Examples 1 to 3 are each characterized in that an epitaxial multilayer film substitutes for the AR multilayer film 31 shown in FIG. 15. In Modification Example 1 shown in FIG. 16, an epitaxial multilayer film 31a located between an InP substrate 51 and an InP buffer layer 2 is made to have the function of the AR multilayer film. In Modification Example 2 shown in FIG. 17, a buffer layer 31b above an InP substrate 51 is composed of an epitaxial multilayer film so as to have the function of the AR multilayer film. In Modification Example 3 shown in FIG. 18, an epitaxial multilayer film 31c located between an InP buffer layer 2 and an absorption layer 3 substitutes for the AR multilayer film 31. The photodetectors in Modification Examples 1 to 3 are advantageous in that in the process of depositing the epitaxial film including the absorption layer 3 on the InP substrate 51, the epitaxial multilayer films 31a, 31b, and 31c can be easily formed. Any epitaxial multilayer film may be used as long as the epitaxial multilayer film does not absorb light significantly and the difference in lattice constant between the epitaxial multilayer film and the substrate or the absorption layer is not significantly large. In the case of a photodiode having an absorption layer composed of GaInNAs, GaInNAsP, GaInNAsSb, or the like used for SWIR light, although depends on the wavelength received, examples of the epitaxial multilayer film include (EP1) InGaAs, (EP2) GaInNAs, (EP3) InGaAs and GaInNAs to which Al or P is added, (EP4) InGaAs and GaInNAs combined with InGaAs and GaInNAs to which Al or P is added, and (EP5) InGaAs or GaInNAs to which Al or P is added in a predetermined amount combined with InGaAs or GaInNAS to which Al or P is added in an amount different from the predetermined amount is added.

Fifth Embodiment

Figure 19:
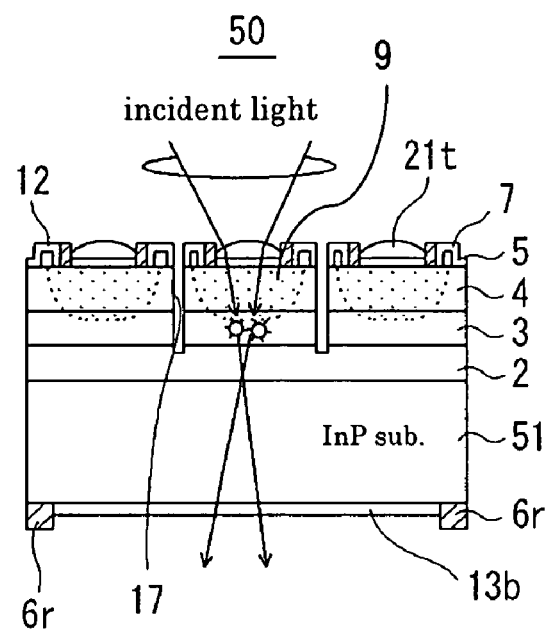
FIG. 19 is a sectional view showing a photodetector according to a fifth embodiment of the present invention.

FIG. 19 is a sectional view showing a photodetector according to a fifth embodiment of the present invention. The first to fourth embodiments described above relate to photodetectors including epitaxial-side-down mounted photodiodes. This embodiment is characterized in that a photodetector is of epitaxial-side-up mounted type in which an epitaxial layer is disposed on the light-incident side. Photodiodes 10 are disposed on a common n-type InP substrate 51, and isolated from adjacent photodiodes by means of separation grooves 17. Each photodiode has a structure including n-type InP buffer layer 2/absorption layer 3/InP window layer 4/passivation film 12 disposed in that order on the InP substrate. A p-type region 9 extends from the InP window layer 4 to the inside of the absorption layer 3. Each p-electrode 7, which is an epitaxial-side electrode, is ring-shaped, and a lens 21t is disposed inside the ring. An n-electrode 6r, which is a substrate-side electrode and which is a counterpart electrode to the epitaxial-side electrode, is formed into a ring shape on the back surface of the n-type InP substrate 51 so that the ring surrounds a region corresponding to the plurality of photodiodes. An AR film 13b, which is emission means, is disposed on the back surface of the InP substrate 51. A diffusion mask 6 used for introducing an impurity by a diffusion method remains on the epitaxial-side surface.

In the photodetector 50 including epitaxial-side-up mounted photodiodes shown in FIG. 19, if the epitaxial-side p-electrode 7 is located in the center of each photodiode at the incident surface, even light entering the photodiode at an incident angle close to the vertical is easily scattered by the p-electrode 7 located in the center. As a result, it is not possible to receive light that is supposed to contribute to electric signals of the photodiode. Furthermore, because of the scattering, a large amount of light may stray into adjacent photodiodes. Actually, in the photodetector shown in FIG. 19, since the p-electrode 7 is ring-shaped so as to surround the corresponding photodiode at the incident surface, incident light with an incident angle close to the vertical enters and received by the photodiode and light straying into adjacent photodiodes is greatly limited.

Furthermore, in the photodetector shown in FIG. 19, since the lens 21t is disposed inside the ring-shaped p-electrode 7, the path of light entering obliquely is changed to a more vertical direction, and thus the factor of occurrence of crosstalk is reduced. Furthermore, since the n-electrode 6r, which is a substrate-side electrode provided on the back surface opposite to the light-incident surface, is formed in a ring shape so as to surround the region of the plurality of photodiodes, it does not occur that light strays into adjacent photodiodes due to the reflection at the back surface of the InP substrate 51. Furthermore, because of the presence of the AR film 13b covering the back surface of the InP substrate 51, reflection by the back surface of the InP substrate 51 is also eliminated. As described above, in the case of epitaxial-side-up mounting, it is also effective to form the p-electrode 7, which is the epitaxial-side electrode, into a ring shape so as to surround the center of the photodiode in order to suppress crosstalk. Similarly, in the case of epitaxial-side-up mounting, it is also effective to dispose an optical element, such as a lens, inside the ring of the ring-shaped p-electrode.

EXAMPLES

Figure 20:
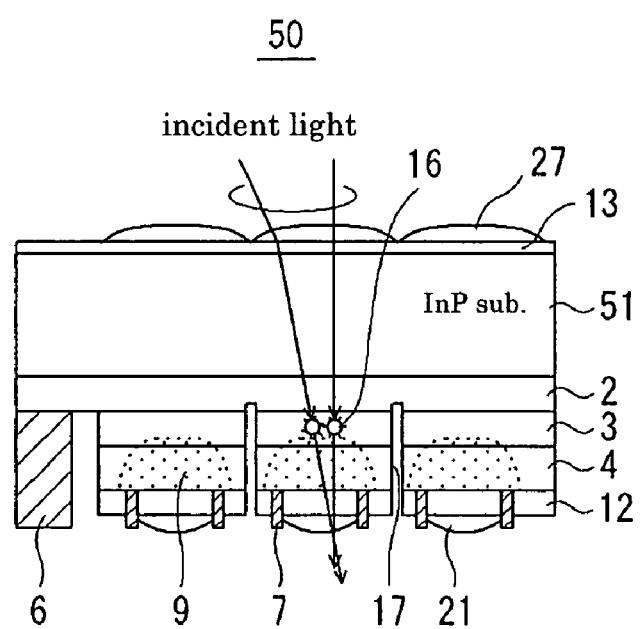
FIG. 20 is a sectional view showing a photodetector according to an example of the present invention.
Figure 25:
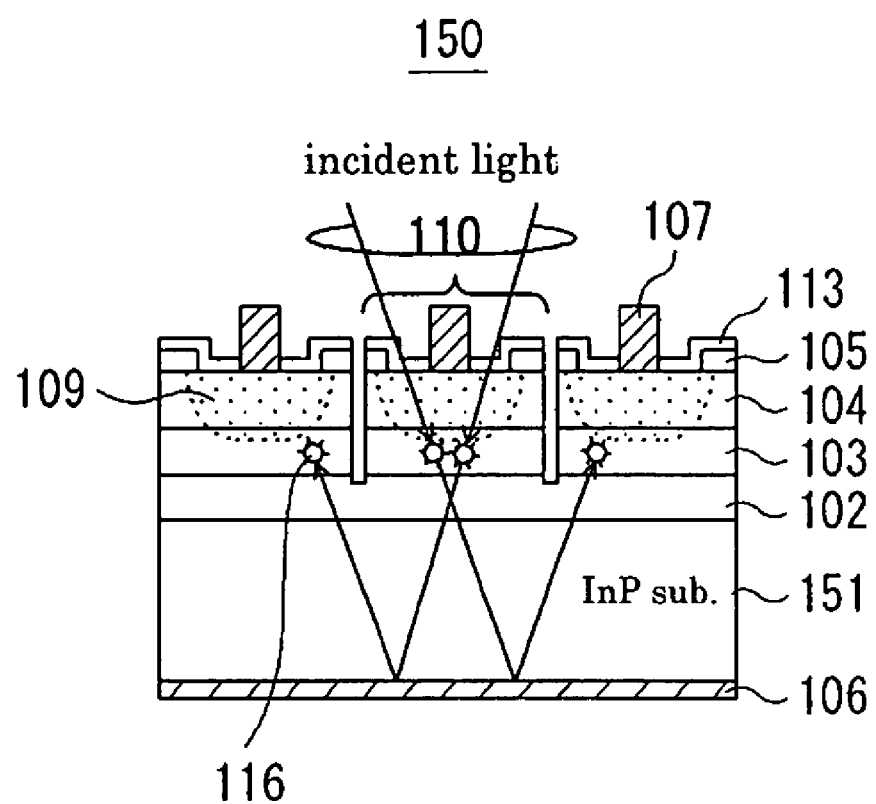
FIG. 25 is a sectional view showing a conventional photodetector according to a reference example.

As an example of the present invention, a photodiode shown in FIG. 20 was fabricated such that photodiodes were arrayed as shown in FIG. 2 at a pitch of 25 μm. As a comparative example, a photodetector shown in FIG. 24 was fabricated under the same pitch condition. Crosstalk was measured. The example of the present invention is characterized in that, as shown in FIG. 20, in each photodiode, a lens 27 which is an optical element serving as an incident-side-limited condensing part is provided on the light-incident side, and a ring-shaped epitaxial-side electrode (p-electrode) 7 is provided on the mounting side. The lens 27 is disposed on an AR film 13. An InP buffer layer 2, an $In_{0.53}Ga_{0.47}S$ absorption layer 3, an InP window layer 4, a passivation film 12, and a lens 21 are disposed in that order on an InP substrate 51. The lens 21 corresponds to emission means. In the photodetector 150 of the comparative example shown in FIG. 24, similarly, an InP buffer layer 102, an $In_{0.53}Ga_{0.47}S$ absorption layer 103, an InP window layer 104, and a passivation film 112 are disposed on an InP substrate 151. An AR film 113 is disposed on the surface of the InP substrate 151 on the light-incident side. A p-electrode 107, which is an epitaxial-side electrode, shaped like a patch, is disposed on the center of the region of each photodiode 110. An n-electrode 106 is connected to the n-type InP buffer layer 102, and flip-chip mounting (epitaxial-side-down mounting) is implemented. The photodiodes 110 are isolated from each other by means of separation grooves 117. A known example of a photodetector of epitaxial-side-up mounting type shown in FIG. 25, which is for comparative reference only and which was not fabricated in Examples, has a similar structure to that of the photodetector shown in FIG. 24 except that a p-electrode 107, which is an epitaxial-side electrode, is disposed so as to protrude from the center of the region of each photodiode and an n-electrode 106 is disposed over the entire back surface of an InP substrate 151.

(Results of Crosstalk Measurement)

Figure 21:
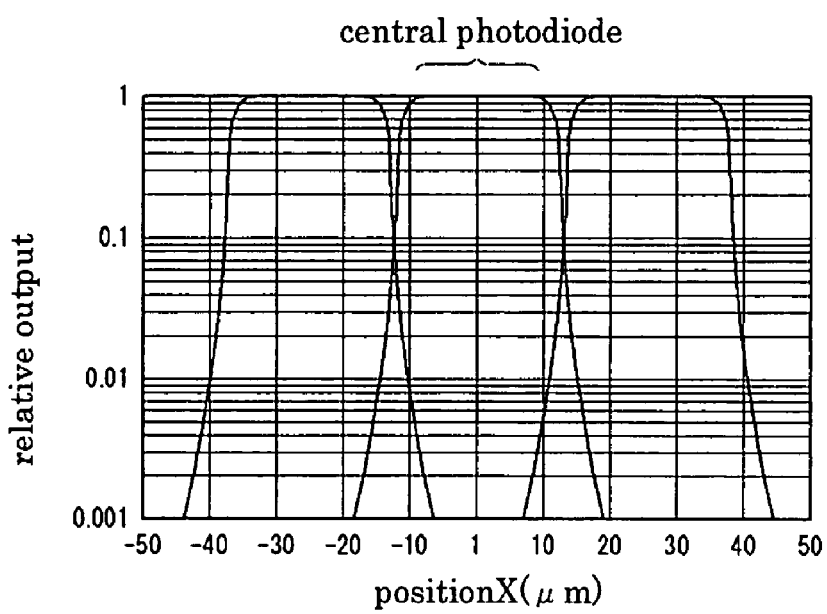
FIG. 21 is a graph showing the results of measurement of crosstalk in the photodetector according to the example of the present invention.
Figure 22:
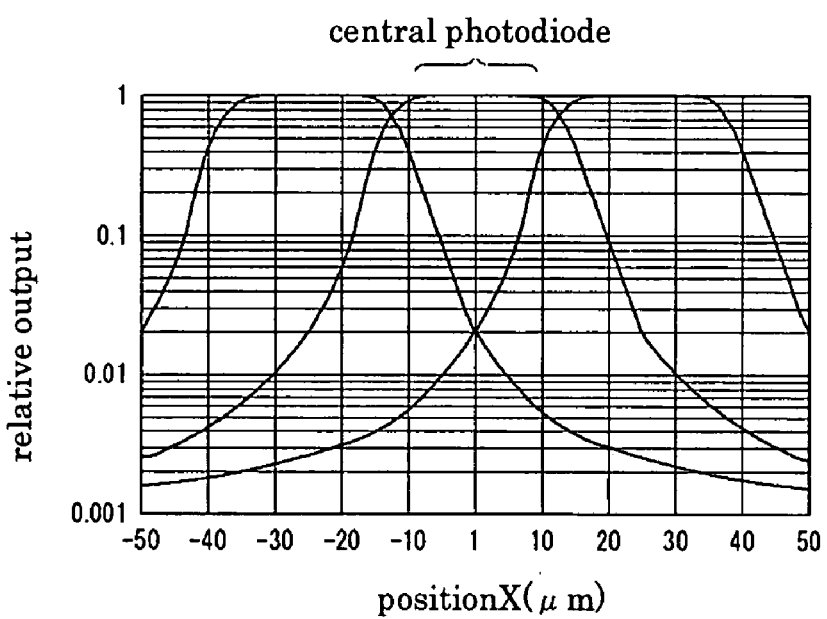
FIG. 22 is a graph showing the results of measurement of crosstalk in a photodetector according a comparative example.

FIG. 21 is a graph showing the results of measurement of crosstalk in the example of the present invention, and FIG. 22 is a graph showing the results of measurement in the comparative example. In the measurement results of the comparative example shown in FIG. 22, the central photodiode has an output that overlaps with outputs of two adjacent photodiodes, the overlaps gently decreasing with distance from the central photodiode, which indicates high crosstalk level. In contrast, in the example of the present invention, although the central photodiode has overlaps in terms of light absorption with two adjacent photodiodes, the output steeply decreases with distance from the central photodiode, and the overlaps are negligible.

As described above, in the example of the present invention, incident light beams are limited to those directed close to the vertical direction, light beams are condensed so as to proceed to absorption layers more vertically, and the light beams that are not absorbed are emitted out of the photodiodes as efficiently as possible. Consequently, it is possible to produce a photodetector which has high resolution with excellent crosstalk characteristics or in which clear images can be obtained. In addition, in any of the photodetectors according to the embodiments of the present invention other than the photodetector described in Examples, crosstalk characteristics superior to those of the photodetector of the comparative example are exhibited although the effect differs according to the structure.

The embodiments and examples described above are only examples of the present invention. It should be noted that the present invention is not limited to such embodiments. It should be understood by those skilled in the art that various modifications may occur depending on design requirements and other factors insofar as they are within the scope of the appended claims or the equivalents thereof.

What is claimed is:

1. A photodetector comprising a plurality of photodiodes disposed on a common semiconductor substrate, each photodiode including an absorption layer epitaxially grown on the common semiconductor substrate and being provided with an epitaxial-side electrode,
wherein each photodiode is provided with at least one of a ring-shaped or crescent-shaped epitaxial-side electrode, an incident-side-limited condensing part which condenses incident light that is directed to the corresponding photodiode only, and emission means which is disposed on a side opposite to a light-incident side of the absorption layer and which allows light entering from the light-incident side to be easily emitted out of the photodiode.

2. The photodetector according to claim 1, wherein the photodiodes are mounted epitaxial-side-down, and the ring-shaped epitaxial-side electrode is provided on an epitaxial layer side opposite to the light-incident side.

3. The photodetector according to claim 1, wherein the photodiodes are mounted epitaxial-side-up, the ring-shaped epitaxial-side electrode is provided on the light-incident side, and a ring-shaped substrate-side electrode is provided on a back surface of the semiconductor substrate so as to surround a region corresponding to the plurality of photodiodes.

4. The photodetector according to any one of claims 1 to 3, wherein an anti-reflection film is provided on a surface opposite to the light-incident side of each photodiode.

5. The photodetector according to claim 1, wherein a lens is provided on a surface of the epitaxial layer of each photodiode.

6. The photodetector according to claim 1, wherein the photodiodes are mounted epitaxial-side-down, and the incident-side-limited condensing part is a dent region provided on each photodiode at the light-incident surface of the semiconductor substrate.

7. The photodetector according to claim 6, wherein, in the light-incident surface of the semiconductor substrate of the photodiodes, exposed surfaces other than the bottom surfaces of the dent regions are covered with a light-shielding layer that does not transmit light.

8. The photodetector according to claim 6, wherein, in the light-incident surface of the semiconductor substrate of the photodiodes, exposed surfaces other than the bottom surfaces of the dent regions are subjected to treatment to prevent light transmission.

9. The photodetector according to claim 6, wherein a gradient refractive index layer is embedded in each dent region so that the refractive index is low at the light-incident side and the refractive index is high at the bottom side.

10. The photodetector according to claim 1, wherein the incident-side-limited condensing part is composed of an optical element located above the light-incident surface of each photodiode.

11. The photodetector according to claim 1, wherein the incident-side-limited condensing part is an optical component having a multilayer structure.

12. The photodetector according to claim 11, wherein the photodiodes are mounted epitaxial-side-down, and an epitaxial multilayer film, which serves as the optical component having the multilayer structure, is disposed between the light-incident surface of the semiconductor substrate and a buffer layer disposed on the semiconductor substrate.

13. The photodetector according to claim 11, wherein the photodiodes are mounted epitaxial-side-down, and an epitaxial multilayer film, which serves as the optical component having the multilayer structure, is a buffer layer disposed on the semiconductor substrate.

14. The photodetector according to claim 11, wherein the photodiodes are mounted epitaxial-side-down, and an epitaxial multilayer film, which serves as the optical component having the multilayer structure, is disposed between a buffer layer disposed on the semiconductor substrate and the absorption layer on the buffer layer.

15. The photodetector according to claim 1, wherein the photodetector is used to detect light in the wavelength range of 1.0 to 3.0 μm, the semiconductor substrate is composed of an InP substrate, the bandgap wavelength of the absorption layer is in the range of 1.65 to 3.0 μm, and the absorption layer is composed of at least one of GaInNAsP, GaInNAsSb, and GaInNAs.

* * * * *